US006285228B1

(12) United States Patent
Heyne et al.

(10) Patent No.: US 6,285,228 B1
(45) Date of Patent: Sep. 4, 2001

(54) INTEGRATED CIRCUIT FOR GENERATING A PHASE-SHIFTED OUTPUT CLOCK SIGNAL FROM A CLOCK SIGNAL

(75) Inventors: Patrick Heyne; Thomas Hein; Torsten Partsch; Thilo Marx, all of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/606,594

(22) Filed: Jun. 29, 2000

(30) Foreign Application Priority Data

Jun. 29, 1999 (DE) .............................. 199 29 801

(51) Int. Cl.$^7$ ................ H03K 5/00; H03L 7/00
(52) U.S. Cl. .......................... 327/246; 327/231

(58) Field of Search ................... 327/231, 234, 327/236, 244, 246

(56) References Cited

U.S. PATENT DOCUMENTS

| 4,663,594 | 5/1987 | Perkins ................... 327/231 |
| 4,782,246 | * 11/1988 | Kuroyanagi et al. ............ 327/236 |
| 5,157,288 | * 10/1992 | Hill .................... 327/231 |

* cited by examiner

*Primary Examiner*—Dinh T. Le
(74) *Attorney, Agent, or Firm*—Herbert L. Lerner; Laurence A. Greenberg; Werner H. Stemer

(57) ABSTRACT

The integrated circuit generates an output clock signal with a phase shift relative to a first clock signal. The currents $I_E=I_1$ and $I_L=I_2$ can be weighted differently by means of control signals. A different phase shift of the output clock signal results depending on the weighting.

7 Claims, 4 Drawing Sheets

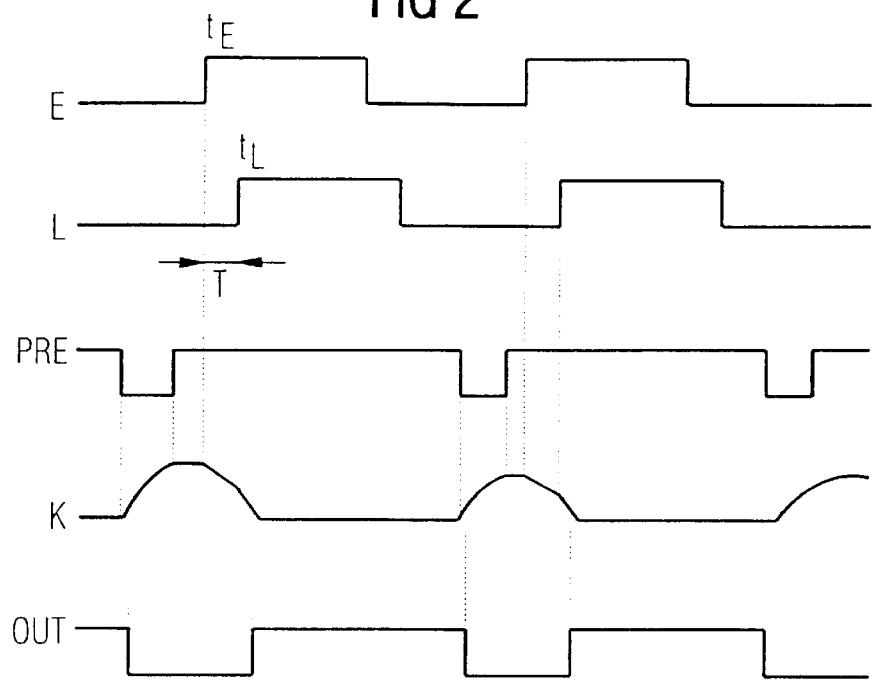
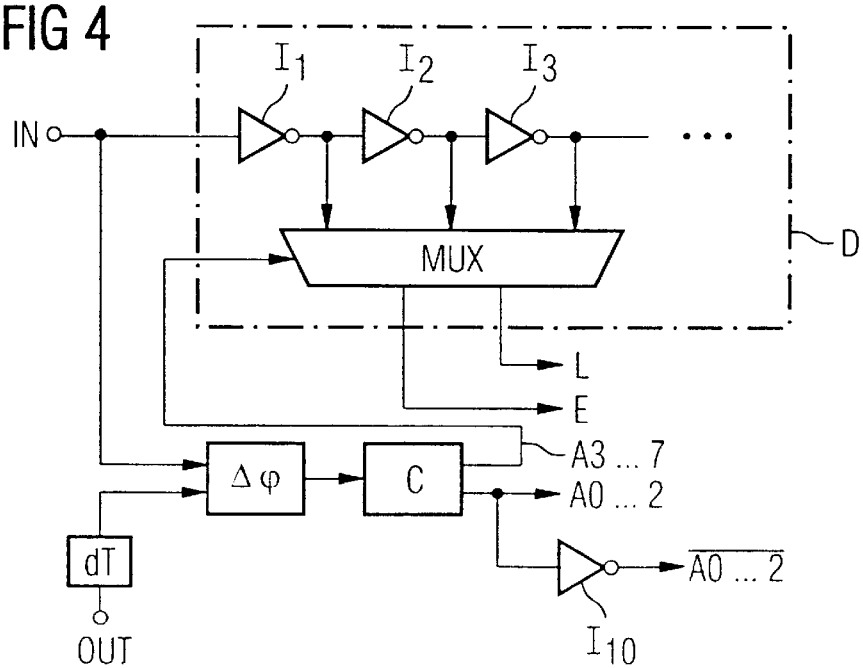

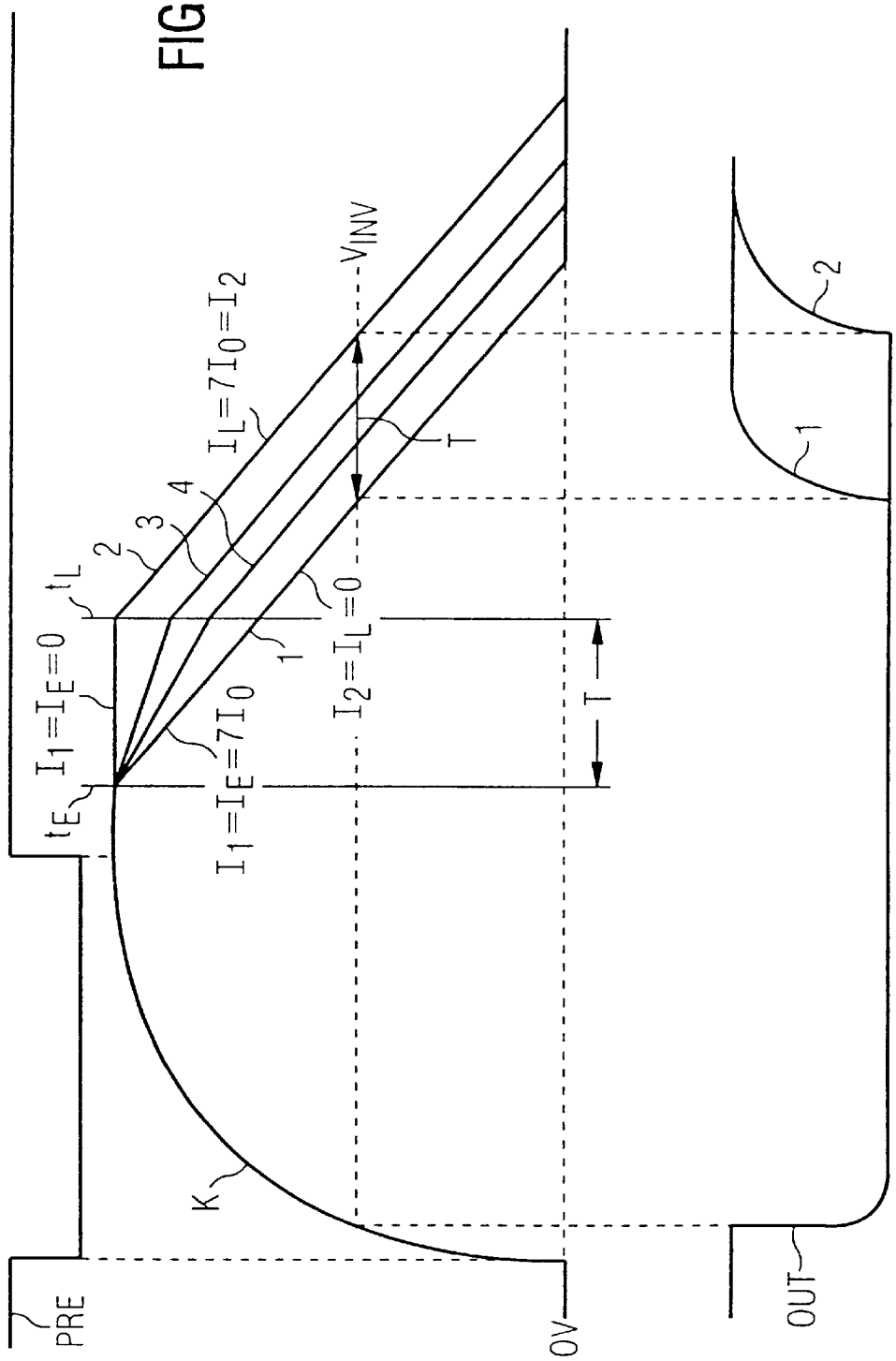

INTEGRATED CIRCUIT FOR GENERATING A PHASE-SHIFTED OUTPUT CLOCK SIGNAL FROM A CLOCK SIGNAL

BACKGROUND OF THE INVENTION

1. Field of the Invention

The invention lies in the integrated technology field. More specifically, the invention relates to an integrated circuit which generates a phase-shifted output clock signal from a first clock signal. The phase shift is thereby adjustable.

One way of obtaining an adjustable phase shift of an output clock signal relative to an input clock signal consists in providing a series circuit formed by a plurality of identical delay elements, to which the input clock signal is fed on the input side. All of the delay elements thereby have the same delay time. The output signals of the series-connected delay elements have a respectively different phase shift relative to the input clock signal, since the delay time of the delay elements is short relative to the clock period of the input clock signal. The output signal of an arbitrary one of the delay elements can be selected by a multiplexer, by means of a control signal. Consequently, by driving the multiplexer, an output clock signal having the desired phase shift relative to the input clock signal can be taken from the series circuit of delay elements.

Inverters, for example, are used as delay elements. However, their minimum delay time is dependent on the production technology that is employed and cannot, therefore, be shortened arbitrarily. It follows from this that the phase shift of the output clock signal relative to the input clock signal can be altered only in relatively coarse steps corresponding to the delay time of the individual delay elements.

2. Summary of the Invention

The object of the invention is to provide an integrated circuit for generating from a clock signal a phase shifted output clock signal which overcomes the above-noted deficiencies and disadvantages of the prior art devices and methods of this kind, and which allows the phase shift between the first clock signal and the output clock signal to be adjusted and altered in finer steps.

With the above and other objects in view there is provided, in accordance with the invention, an integrated circuit, comprising:

an adjustable current source having a first output outputting a first adjustable current and a second output outputting a second adjustable current, wherein a sum of the first and second currents is substantially constant for different settings, and at least one control input for receiving a control signal for setting the first and second currents;

a first transistor connected between the first output of the current source and a supply line for a first potential, the first transistor having a first channel terminal connected to the supply line and a second channel terminal remote therefrom, and a second transistor connected between the second output of the current source and the supply line for the first potential, the second transistor having a first channel terminal connected to the supply line and a second channel terminal remote therefrom;

a circuit node and a precharge unit connected to the circuit node for precharging the circuit node to a second potential;

a series circuit formed by a third transistor and a fourth transistor connected between the circuit node and the supply line;

the third transistor having a control terminal connected to a first clock signal, the first transistor having a control terminal connected to the second channel terminal thereof, and the fourth transistor having a control terminal connected to the control terminal of the first transistor;

a series circuit formed by a fifth transistor and a sixth transistor connected between the circuit node and the supply line;

the fifth transistor having a control terminal connected to a second clock signal, phase-shifted relative to the first clock signal, the second transistor having a control terminal connected to the second channel terminal thereof, and the sixth transistor having a control terminal connected to the control terminal of the second transistor; and a level detector having an input connected to the circuit node and an output supplying an output clock signal at a first level if the potential at the circuit node lies below a lower switching threshold of the level detector, and at a second level if the potential at the circuit node lies above an upper switching threshold.

In accordance with the invention, therefore, the phase shift between the output clock signal and the first clock signal is set by altering the values of the two currents supplied by the current source. The finer the adjustment steps for the two currents, the finer the steps in which the phase shift can be altered. In this case, the step size of the adjustable phase shift is dependent on the "resolution" of the adjustable current source and no longer on the production technology of the integrated circuit.

In accordance with an added feature of the invention, the integrated circuit further comprises:

an adjustable delay unit having an input receiving an input clock signal, an output for the first clock signal, and a control input for setting a delay time thereof;

a phase comparator having a first input connected to the input clock signal, a second input connected to the output of the level detector, and an output; and a phase regulator having an input connected to the output of the phase comparator, the phase regulator generating a coarse control signal and a fine control signal depending on a phase difference ascertained by the phase comparator, and having a first output for outputting the coarse control signal connected to the control input of the delay unit and a second output for outputting the fine control signal connected to the control input of the adjustable current source.

In accordance with an additional feature of the invention, the phase shift between the first clock signal and the second clock signal is substantially equal to a minimum delay step of the delay unit by which a delay time of the delay unit is adjustable with the coarse control signal.

In accordance with another feature of the invention, the delay unit comprises a series circuit of delay elements each having a delay time corresponding to the minimum delay step; and the first clock signal generated by the delay unit is an input signal of a given one of the delay elements and the second clock signal is an output signal of the given delay element.

In accordance with a further feature of the invention, the first clock signal generated by the delay unit is an output signal of one of the delay elements; and the circuit has an additional delay element, having a delay time substantially corresponding to the delay time of the delay elements of the delay unit, having an input connected to the output of the delay unit, and having an output supplying the second clock signal.

In accordance with again a further feature of the invention, a first capacitor is connected between the supply line and the control terminals of the first and fourth transistors, and a second capacitor is connected between the supply line and the control terminals of the second and sixth transistors.

In accordance with a concomitant feature of the invention, the first output of the current source is connected to the supply line via a series circuit formed by the first transistor and a seventh transistor; the second output of the current source is connected to the supply line via a series circuit formed by the second transistor and an eighth transistor; and the seventh transistor and the eighth transistor each has a control input connected to a supply line for the second potential.

Other features which are considered as characteristic for the invention are set forth in the appended claims.

Although the invention is illustrated and described herein as embodied in an integrated circuit for generating a phase-shifted output clock signal from a clock signal, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS

FIG. 2 are several signal traces showing signal profiles relating to the circuit of FIG. 1;

FIG. 3 is an enlarged detail of signal profiles from FIG. 2;

FIG. 4 is a schematic of a partial circuit of the integrated circuit which supplies input signals for the partial circuit of FIG. 1;

DESCRIPTION OF THE PREFERRED EMBODIMENTS

Figure 1:
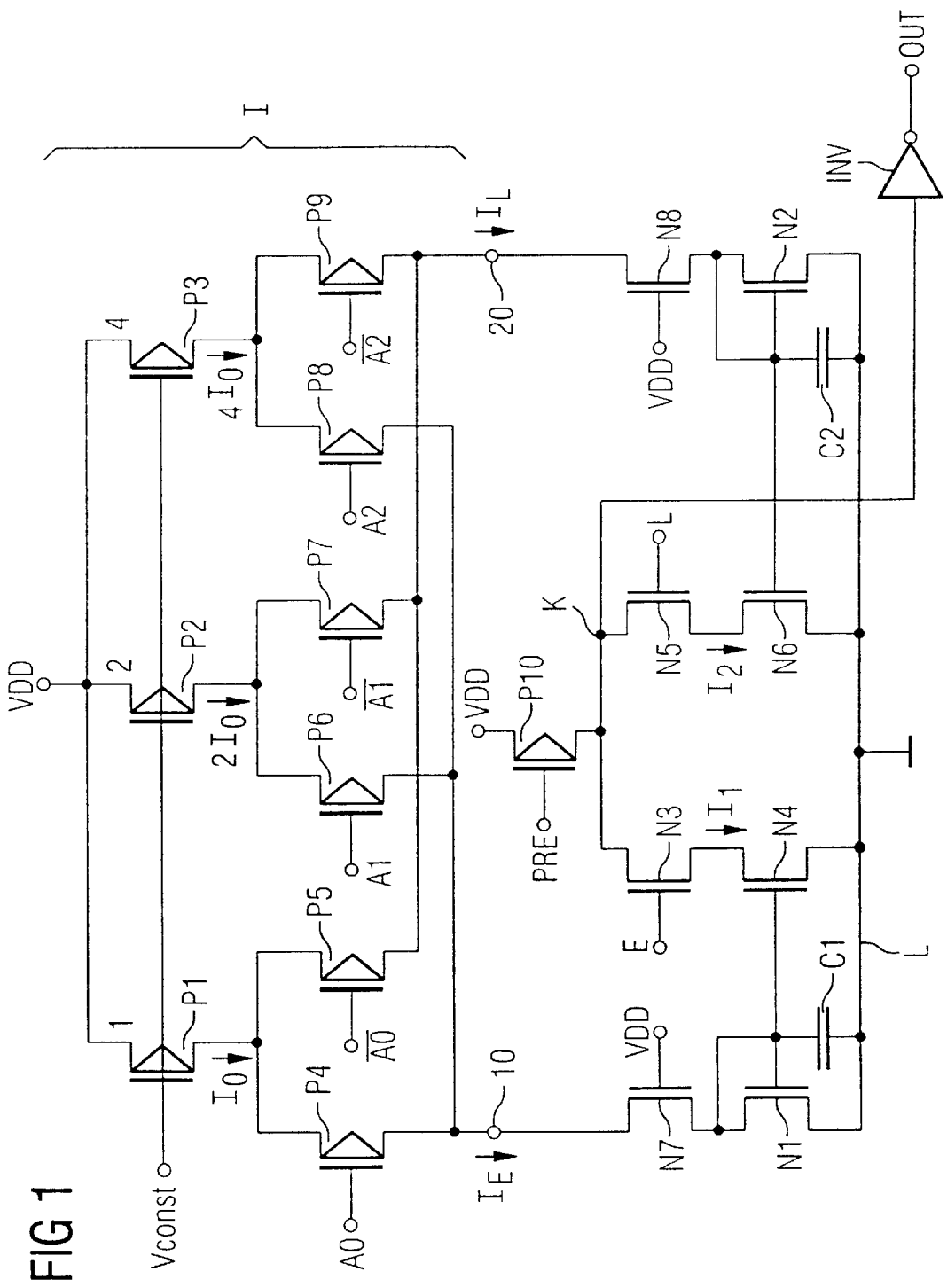
FIG. 1 is a schematic showing a partial circuit of the integrated circuit.

Referring now to the figures of the drawing in detail and first, particularly, to FIG. 1 thereof, there is seen an adjustable current source I, which supplies a respective adjustable current $I_E$, $I_L$ at two outputs 10, 20. The current source has three p-channel transistors P1, P2, P3, whose first channel terminals are connected to a positive supply potential VDD. The gate terminals of the p-channel transistors are connected to a constant potential Vconst. The current conductivity of the three transistors P1, P2, P3 differs in each case by a factor of 2 in the ON state. Therefore, the second p-channel transistor P2 has a conductivity twice as high as that of the first p-channel transistor P1, and a conductivity half as large as that of the third p-channel transistor P3. This is indicated by the numerals 1, 2, 4 in FIG. 1. The second channel terminals of the three transistors P1, P2, P3 are connected via a respective further p-channel transistor P4, P6, P8 to the first output 10 of the current source I and via a respective other p-channel transistor P5, P7, P9 to the second output 20. At their gate, the transistors P4, P6, P8 are connected to control signals A0, A1, A2 and the transistors P5, P7, P9 are connected to the control signals /A0, /A1, /A2 that are complementary thereto. While the three transistors P1, P2, P3 serve as constant-current sources which each supply constant currents $I_0$, $2I_0$, $4I_0$ which differ by the factor 2, of the transistor pairs P4, P5; P6, P7; P8, P9 only one of the two transistors is turned on in each case, since the control signals Ai are digital signals. By means of the controls signals Ai and their complements /Ai, the values of the output currents $I_E$, $I_L$ of the current source I can be progressively altered, but the sum of the two currents always remains constant. The sum is $7I_0$ in the exemplary embodiment. The current source I in FIG. 1 is thus a digital-to-analog converter in which the digital control signals Ai are converted into the analog currents $I_E$, $I_L$.

It will be understood by those skilled in the pertinent art that it is equally possible in the context of the invention to use, instead of the current source I just described, any other adjustable current sources which supply two output currents the value of which is adjustable and the sum of which is constant for each setting.

The circuit according to the invention in FIG. 1 furthermore has eight n-channel transistors N1 to N8, the arrangement of which is described below:

The first output 10 of the current source I is connected via the seventh transistor N7 and the first transistor N1 to a supply line L for a ground potential. The gate of the seventh transistor N7 is connected to the positive supply potential VDD. The gate of the first transistor N1 is connected to the drain of the latter and, via a first capacitor C1, to ground. The second output 20 of the current source I is connected to ground via the eighth transistor N8 and the second transistor N2. The gate of the eighth transistor N8 is connected to the positive supply potential VDD. The gate of the second transistor N2 is connected to the drain of the latter and, via a second capacitor C2, to ground.

The positive supply potential VDD is connected via a tenth p-channel transistor P10 to a circuit node K. The gate of the p-channel transistor P10 is connected to a precharge signal PRE. The circuit node K is connected to ground via the third transistor N3 and the fourth transistor N4. In addition, it is likewise connected to ground via the fifth transistor N5 and the sixth transistor N6. The gate of the third transistor N3 is connected to a first clock signal E and the gate of the fifth transistor N5 is connected to a second clock signal L. The gate of the fourth transistor N4 is connected to the gate of the first transistor N1 and the gate of the sixth transistor N6 is connected to the gate of the second transistor N2. A first current $I_1$ flows through the series circuit formed by the third N3 and fourth N4 transistors, and a second current $I_2$ flows through the series circuit formed by the fifth N5 and sixth N6 transistors. The first N1 and the fourth N4 transistors form a first current mirror and the second N2 and the sixth N6 transistors form a second current mirror. If, therefore, the third N3 and/or the fifth N5 transistor are turned on and the circuit node is not completely discharged to ground potential, the first current $I_1$ is proportional to the current $I_E$ at the first output 10 of the current source I and the second current $I_2$ is proportional to the current $I_L$ at the second output 20 of the current source I. In this exemplary embodiment, the current mirrors have been dimensioned in such a way that the first current $I_1$ corresponds to the current $I_E$ at the first output 10 of the current source and the second current $I_2$ corresponds to the current $I_L$ at the second output 20 of the current source I. It thus holds that $I_1=I_E$ and $I_2=I_L$.

The circuit node K is connected via an inverter INV to an output of the partial circuit—shown in FIG. 1—of the integrated circuit according to the invention. The output carries an output clock signal OUT.

The seventh transistor N7 and the eighth transistor N8 are dimensioned in exactly the same way as the third transistor N3 and the fifth transistor N5. They serve merely to balance the circuit and can also be omitted in other exemplary embodiments of the invention. The capacitors C1, C2 serve to stabilize the potentials at the gate of the first transistor N1 and of the second transistor N2. Without the presence of the capacitors C1, C2, these potentials can easily be influenced in the event of level changes of the clock signals E, L by means of the gate-source capacitances of the third N3 and fifth N5 transistors and the gate-drain capacitances of the fourth N4 and sixth N6 transistors. The capacitors C1, C2 can also be omitted in other exemplary embodiments of the invention.

Figure 6:
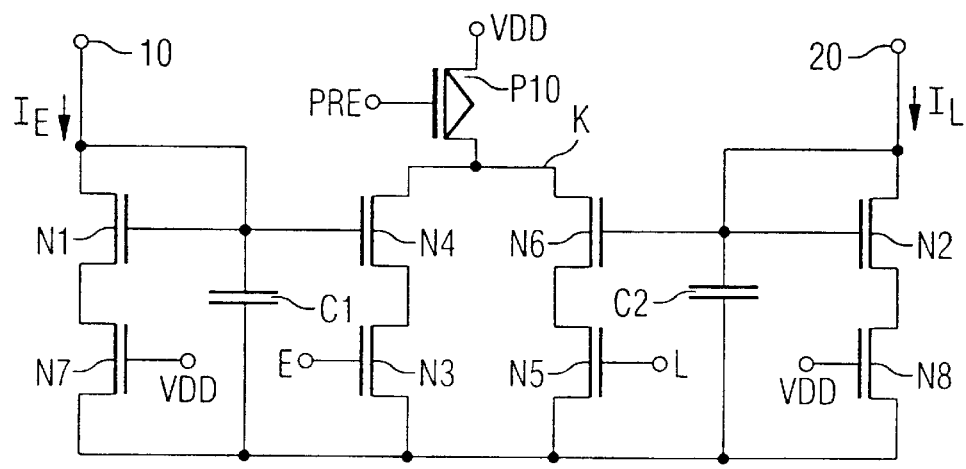
FIG. 6 is a schematic of an alternative partial circuit of the integrated circuit to the partial circuit shown in FIG. 1.

FIG. 6 shows an alternative exemplary embodiment to the lower part of FIG. 1, in which the order of the third N3 and fourth N4 transistors and of the fifth N5 and sixth N6 transistors has been interchanged. The order of the remaining n-channel transistors N1, N7; N2, N8 has also been interchanged correspondingly. As an alternative to this, the capacitors C1, C2 and/or the seventh transistor N7 and the eighth transistor N8 may once again be omitted.

FIG. 2 shows signal profiles relating to the circuit illustrated in FIG. 1. The second clock signal L is phase-shifted by a time period T relative to the first clock signal E. Before the positive edge of the first clock signal E, in other words while the third N3 and fifth N5 transistors are turned off, the circuit node K is charged to the value of the positive supply potential VDD by means of the precharge signal PRE. The tenth p-channel transistor P10 is subsequently turned off. With the positive edge of the first clock signal E, which occurs at an early instant $t_E$, first of all the third transistor N3 is turned on, with the result that the circuit node K is discharged by the first current $I_1$ (shallow gradient of the potential profile at the circuit node K). With the positive edge of the second clock signal L at a late instant $t_L$, the fifth transistor N5 is also switched on in addition to the third transistor N3, with the result that the circuit node is now discharged further by both the first current $I_1$ and the second current $I_2$ (steep gradient of the potential profile at the circuit node K). In FIG. 2, in the case of the potential profile of the circuit node K, the shallow gradient which the latter has between the positive edge of the first clock signal E, which occurs at an early instant $t_E$, and that of the second clock signal L has been extrapolated by a broken line.

FIG. 2 additionally shows the profile of the output clock signal OUT, which results from the potential at the circuit node K in the following manner:

The inverter INV has an upper and a lower switching threshold $V_{INV}$, which have been assumed to be identical in this exemplary embodiment in order to simplify matters. If the potential at the circuit node K exceeds the upper switching threshold, the output clock signal OUT has a negative edge. If the potential at the circuit node K falls below the lower switching threshold of the inverter INV, the output clock signal OUT has a positive edge.

In order to provide a better understanding, FIG. 3 once again shows an enlarged detail of the precharge signal PRE, of the potential profile at the circuit node K and of the output clock signal OUT. During a low level (ground) of the precharge signal PRE, the circuit node K is first of all charged to a high level (VDD). In this case, the potential of the circuit node K exceeds the (upper) switching threshold $V_{INV}$ of the inverter INV, which results in a negative edge of the output clock signal OUT. At the early instant $t_E$, the third transistor N3 is turned on on account of the positive edge of the first clock signal E, with the result that first of all only the first current $I_1$ flows.

After the early instant $t_E$, FIG. 3 shows four different profiles for the potential of the circuit node K, which result for different values of the currents $I_1$, $I_2$ and are designated by the numerals 1 to 4. In this case, the profile 1 corresponds to the case where the first current $I_1=7I_0$, that is to say is a maximum, and the second current $I_2$ is 0 even after the late instant $t_L$. This results in the case of the current source I illustrated in FIG. 1 when the control signals A0, A1, A2=000. The profile 2 of the potential at the circuit node K in FIG. 3 corresponds to the case where the current $I_1=0$ and the second current $I_2$ is a maximum. The profiles 3 and 4 in FIG. 3 designate cases in which the currents I1, I2 assume other values.

If the current $I_1$ is large, then the circuit node K is discharged more rapidly than if $I_1$ is small. As soon as the positive edge of the second clock signal L occurs, the second current $I_2$ also flows, with the result that the circuit node K is then discharged by the simultaneously flowing currents $I_1$ and $I_2$. The result, therefore, is the greater steepness of the potential profile at the circuit node K after the late instant $t_L$.

FIG. 3 also reveals the output clock signal OUT has a positive edge as soon as the potential of the circuit node K falls below the (lower) switching threshold $V_{INV}$ of the inverter INV. That profile of the potential at the circuit node K which is designated by "1" results in that positive edge of the output clock signal OUT which is designated by "1" and that profile which is designated by "2" results in that edge of the output clock signal OUT which is designated by "2". It is evident that the instant of the positive edge of the output clock signal OUT can be chosen by the setting of the currents $I_1$, $I_2$ and/or $I_E$, $I_L$. In this case, the earliest possible instant and the latest possible instant of the positive edge of the output clock signal OUT are separated from one another by the time period T.

The circuit illustrated in FIG. 1 thus achieves the effect that the positive edge of the output clock signal OUT is shifted relative to the positive edge of the first clock signal E by a time period which is composed of the time period T, which elapses between the early instant $t_E$ and the late instant $t_L$, and a further time period, which is not in an integer relationship with the time period T. By choosing a more complicated current source I than the one in FIG. 1, the currents $I_1$, $I_2$ may be adjustable in even finer steps. Consequently, with corresponding complexity with regard to the current source, the positive edge of the output clock signal OUT (see FIG. 3) can be set in arbitrarily fine steps between the earliest possible edge 1 and the latest possible edge 2.

FIG. 4 shows a detail of an exemplary embodiment of the invention in which the partial circuit shown in FIG. 1 forms a second stage and the partial circuit shown in FIG. 4 forms a first stage of a phase-locked loop. FIG. 4 shows an adjustable delay unit D having, in a series circuit, a multiplicity of series-connected inverters I1, I2, I3. The delay time of the individual inverters I1 to I3 serving as delay elements corresponds to the time period T illustrated in FIGS. 2 and 3. An input clock signal IN is fed to the input of the series circuit formed by the inverters I1 to I3. In addition, the delay unit D has a multiplexer MUX, which is connected to the outputs of the inverters I1, I2, I3 and, in a manner dependent on a control signal fed via a control input, in each case feeds the output signals of two successive inverters as the first clock signal E and the second clock signal L to the partial circuit shown in FIG. 1.

FIG. 4 additionally shows a phase detector Δϕ, to whose first input the input clock signal IN is fed and to whose second input the output clock signal OUT of the inverter INV from FIG. 1 is fed via a delay element dT. Depending on the phase difference between the input clock signal IN and the output clock signal OUT ascertained by the phase detector Δϕ, a phase regulator C connected downstream of the phase detector Δϕ generates corresponding control signals A0 to A7, which are bits of a digital control word. In this case, the five most significant control bits A3 to A7 are fed to the multiplexer MUX as a coarse control signal and the three least significant control bits A0 to A2 and their complements /A0 to /A2, generated by means of an inverter I10, are fed as fine control signal to the current source I from FIG. 1. Thus, the delay time of the delay unit D is set by means of the coarse control signal A3 to A7 and the additional delay by the partial circuit illustrated in FIG. 1 is set by means of the fine control signal A0 to A2. The fine delay stage once again subdivides, as it were, each adjustable delay step of the coarse delay stage upstream of it.

The output clock signal OUT in FIG. 4 is connected to the second input of the phase detector Δϕ via the delay element dT, with the result that the output clock signal OUT has a phase shift corresponding to the delay time of the delay element dT relative to the input clock signal IN even in the corrected state in which the phase detector Δϕ ascertains a phase difference of zero. A corresponding delay element may also additionally or alternatively be arranged between the input clock signal IN and the first input of the phase detector Δϕ.

Figure 5:
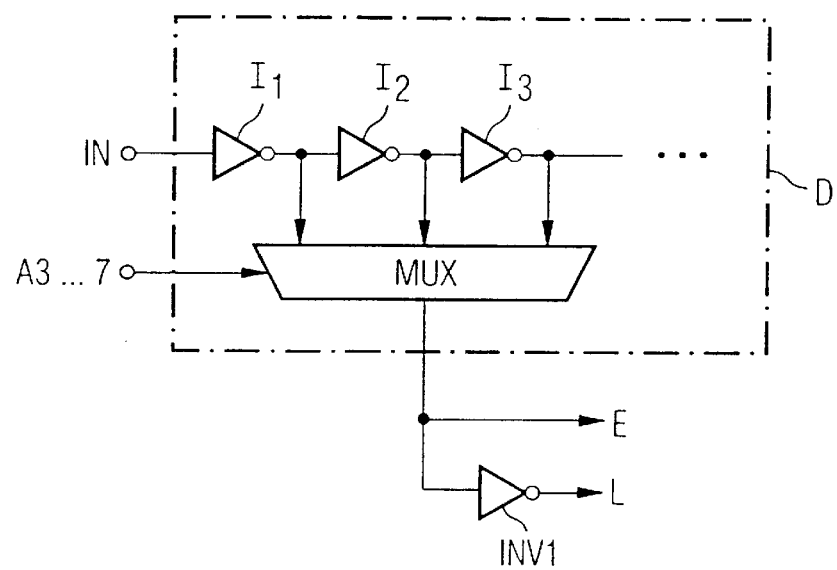
FIG. 5 is a schematic of an alternative partial circuit to the partial circuit shown in FIG. 4.

FIG. 5 shows an alternative embodiment of the delay unit D to that in FIG. 4, in which the multiplexer MUX has not two but just one output, at which it outputs the first clock signal E. The output signal of one of the inverters I1 to I3 is then selected by means of the coarse control signal A3 to A7. An additional inverter INV1 generates the second clock signal L from the first clock signal E. In this case, the delay time of the additional inverter INV1 is equal to the delay time of the individual inverters I1 to I3 of the delay unit D. It is thus ensured that in this embodiment of the invention, too, just as in the embodiment from FIG. 4, the time period T which is equal to the minimum adjustable delay step of the delay unit D elapses between the edges of the first clock signal E and of the second clock signal L.

In the exemplary embodiments as shown in FIGS. 4 and 5, the total phase shift between the output clock signal OUT and the input clock signal IN is composed of the phase shift respectively caused in FIGS. 4 and 5 between the first clock signal E and the input clock signal IN and also the additional phase shift generated by the partial circuit illustrated in FIG. 1.

The delay unit D illustrated in FIGS. 4 and 5 is a coarse delay stage and the partial circuit illustrated in FIG. 1 is a fine delay stage. In the case of the coarse delay stage, the minimum delay change that can be achieved is identical to the delay of the individual inverters I1 to I3 and hence dependent on the production technology used for the integrated circuit. In the case of the fine delay stage, the delay can be altered in much smaller steps, the step size of which depends on the steps in which the output currents $I_E$, $I_L$ of the current source I can be altered.

As an alternative to the delay units D shown in FIG. 4 and FIG. 5, in other embodiments of the invention each delay element of the delay unit D may comprise not merely an inverter circuit I1 to I3 but in each case a plurality of inverters, for example two. The inputs of the multiplexer MUX are then connected only to the outputs of the respective second inverter of each delay element, which form the outputs of each delay element.

In the exemplary embodiments as shown in FIG. 4 and FIG. 5, the phase regulator C may be realized for example as a continuously incrementing or decrementing counter, and the phase detector Δϕ may supply merely a digital output signal which indicates whether the phase difference that it has ascertained is positive or negative. Depending on the sign of the phase difference, the phase regulator C may then either increment or decrement the control signal A0 to A7 until the phase detector Δϕ again indicates to it a change in the sign of the phase difference between the output clock signal OUT and the input clock signal IN.

We claim:

1. An integrated circuit, comprising:

an adjustable current source having a first output outputting a first adjustable current and a second output outputting a second adjustable current, wherein a sum of said first and second currents is substantially constant for different settings, and at least one control input for receiving a control signal for setting the first and second currents;

a supply line for a first potential;

a first transistor connected between said first output of said current source and said supply line for the first potential, said first transistor having a first channel terminal connected to said supply line and a second channel terminal remote therefrom, and a second transistor connected between said second output of said current source and said supply line for the first potential, said second transistor having a first channel terminal connected to said supply line and a second channel terminal remote therefrom;

a circuit node and a precharge unit connected to said circuit node for precharging said circuit node to a second potential;

a series circuit formed by a third transistor and a fourth transistor connected between said circuit node and said supply line;

said third transistor having a control terminal connected to a first clock signal, said first transistor having a control terminal connected to said second channel terminal thereof, and said fourth transistor having a control terminal connected to said control terminal of said first transistor;

a series circuit formed by a fifth transistor and a sixth transistor connected between said circuit node and said supply line;

said fifth transistor having a control terminal connected to a second clock signal, phase-shifted relative to the first clock signal, said second transistor having a control terminal connected to said second channel terminal thereof, and said sixth transistor having a control terminal connected to said control terminal of said second transistor; and a level detector having an input connected to said circuit node and an output supplying an output clock signal at a first level when the potential at said circuit node lies below a lower switching threshold of said level detector, and at a second level when the potential at said circuit node lies above an upper switching threshold.

2. The integrated circuit according to claim 1, which further comprises:

an adjustable delay unit having an input receiving an input clock signal, an output for the first clock signal, and a control input for setting a delay time thereof;

a phase comparator having a first input connected to the input clock signal, a second input connected to said output of said level detector, and an output; and a phase regulator having an input connected to said output of said phase comparator, said phase regulator generating a coarse control signal and a fine control signal depending on a phase difference ascertained by said phase comparator, and having a first output for outputting the coarse control signal connected to said control input of said delay unit and a second output for outputting the fine control signal connected to said control input of said adjustable current source.

3. The integrated circuit according to claim 2, wherein the phase shift between the first clock signal and the second clock signal is substantially equal to a minimum delay step of said delay unit by which a delay time of said delay unit is adjustable with the coarse control signal.

4. The integrated circuit according to claim 3, wherein:

said delay unit comprises a series circuit of delay elements each having a delay time corresponding to the minimum delay step; and the first clock signal generated by said delay unit is an input signal of a given one of said delay elements and the second clock signal is an output signal of the given delay element.

5. The integrated circuit according to claim 3, wherein:

said delay unit comprises a series circuit of delay elements each having a delay time corresponding to the minimum delay step;

the first clock signal generated by the delay unit is an output signal of one of said delay elements; and an additional delay element, having a delay time substantially corresponding to the delay time of said delay elements of said delay unit, having an input connected to said output of said delay unit, and having an output supplying the second clock signal.

6. The integrated circuit according to claim 1, which further comprises a first capacitor connected between said supply line and said control terminals of said first and fourth transistors, and a second capacitor connected between said supply line and said control terminals of said second and sixth transistors.

7. The integrated circuit according to claim 1, wherein:

said first output of said current source is connected to said supply line via a series circuit formed by said first transistor and a seventh transistor;

said second output of said current source is connected to said supply line via a series circuit formed by said second transistor and an eighth transistor; and said seventh transistor and said eighth transistor each has a control input connected to a supply line for the second potential.

* * * * *